(12) United States Patent
Eppich et al.

(10) Patent No.: US 6,723,599 B2
(45) Date of Patent: Apr. 20, 2004

(54) METHODS OF FORMING CAPACITORS AND METHODS OF FORMING CAPACITOR DIELECTRIC LAYERS

(75) Inventors: Denise M. Eppich, Boise, ID (US); Kevin L. Beaman, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/006,032

(22) Filed: Dec. 3, 2001

(65) Prior Publication Data

US 2003/0104669 A1 Jun. 5, 2003

(51) Int. Cl.[7] .......................... H01L 21/8242
(52) U.S. Cl. .................. 438/240; 438/240; 438/250; 438/788
(58) Field of Search .................. 438/3, 240, 253, 438/250, 393, 770, 771, 772, 773, 778, 787, 788

(56) References Cited

U.S. PATENT DOCUMENTS

| | | | |
|---|---|---|---|
| 5,731,235 A | 3/1998 | Srinivasan et al. | 438/253 |
| 5,882,978 A | 3/1999 | Srinivasan et al. | 438/396 |
| 6,001,741 A | * 12/1999 | Alers | 438/706 |
| 6,063,713 A | 6/2000 | Doan | 438/763 |
| 6,077,754 A | 6/2000 | Srinivasan et al. | 438/396 |
| 6,111,744 A | 8/2000 | Doan | 361/311 |
| 6,323,138 B1 | 11/2001 | Doan | 438/763 |
| 6,348,420 B1 | 2/2002 | Raaijmakers et al. | 438/769 |
| 2001/0036752 A1 | * 11/2001 | Deboer et al. | 438/778 |
| 2002/0009861 A1 | * 1/2002 | Narwankar et al. | 438/404 |
| 2002/0052124 A1 | 5/2002 | Raaijmakers et al. | 438/778 |

FOREIGN PATENT DOCUMENTS

EP 2001237243 8/2001

OTHER PUBLICATIONS

U.S. patent application Ser. No. 09/653,281, Beaman et al., filed Aug. 30, 2000.
Laughery et al., *Effect of $H_2$ Content on Reliability of Ultrathin In–Situ Steam Generated (ISSG) $SiO_2$* 21 IEEE Electron Device Letters No. 9, 430–432 (Sep. 2000).

* cited by examiner

Primary Examiner—Tuan H. Nguyen
(74) Attorney, Agent, or Firm—Wells St. John P.S.

(57) ABSTRACT

A method of forming a capacitor includes forming first capacitor electrode material over a semiconductor substrate. A silicon nitride comprising layer is formed over the first capacitor electrode material. The semiconductor substrate with silicon nitride comprising layer is provided within a chamber. An oxygen comprising plasma is generated remote from the chamber. The remote plasma generated oxygen is fed to the semiconductor substrate within the chamber at a substrate temperature of no greater than 750° C. effective to form a silicon oxide comprising layer over the silicon nitride comprising layer. After the feeding, a second capacitor electrode material is formed over the silicon oxide comprising layer. Methods of forming capacitor dielectric layers are also disclosed.

36 Claims, 2 Drawing Sheets

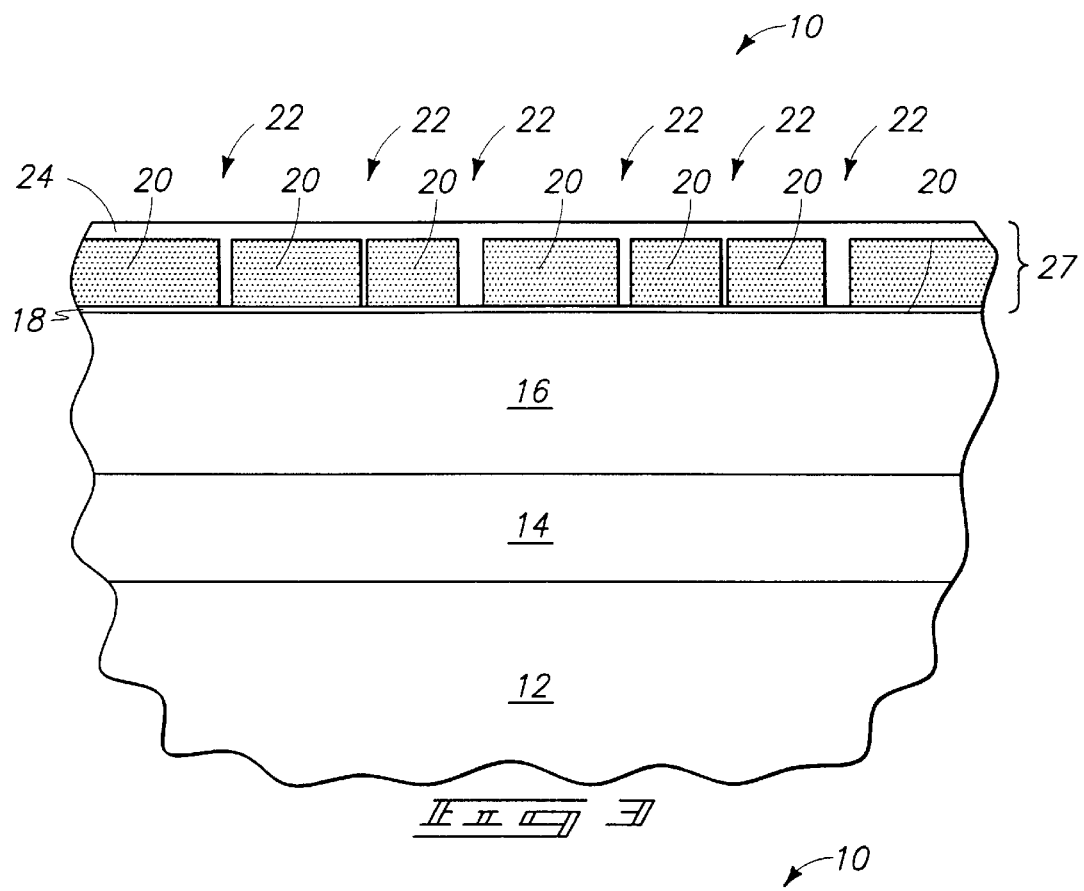
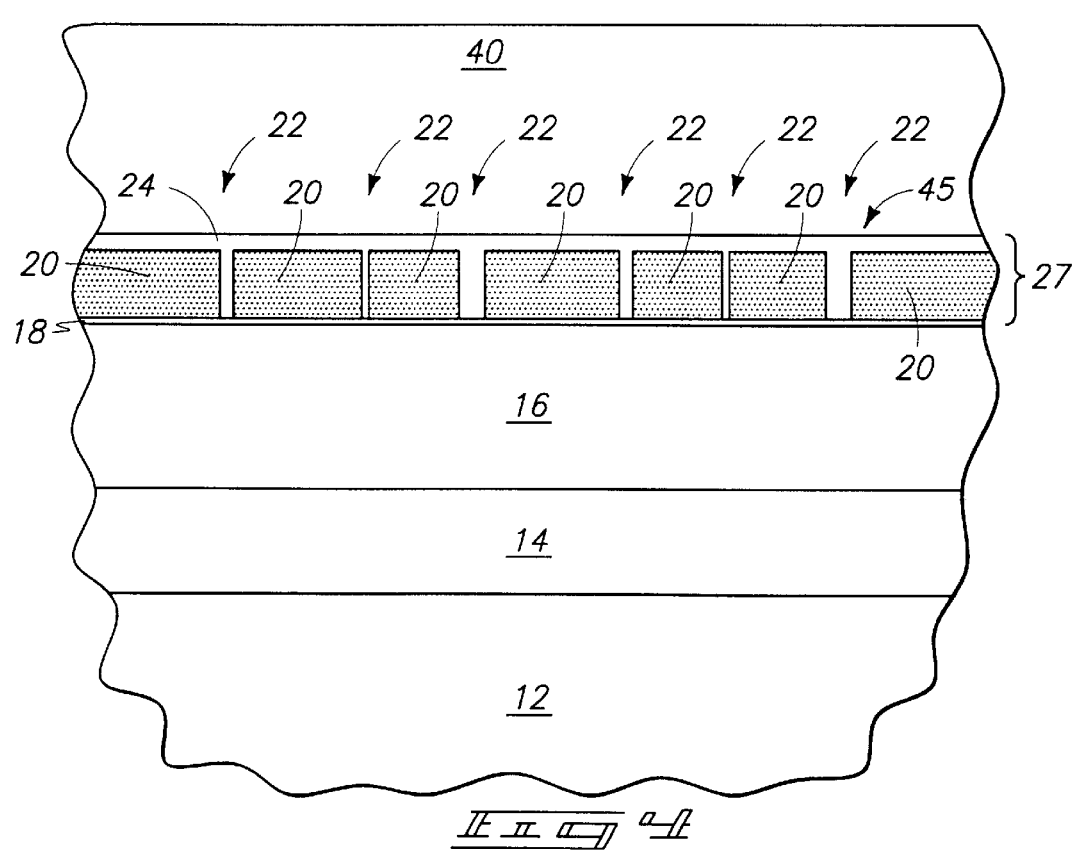

METHODS OF FORMING CAPACITORS AND METHODS OF FORMING CAPACITOR DIELECTRIC LAYERS

TECHNICAL FIELD

This invention relates to methods of forming capacitors and to methods of forming capacitor dielectric layers.

BACKGROUND OF THE INVENTION

Capacitors are commonly-used electrical components in semiconductor circuitry, for example in DRAM circuitry. As integrated circuitry density increases, there is a continuing challenge to maintain sufficiently high storage capacitance despite decreasing capacitor area. A typical capacitor is comprised of two conductive electrodes separated by a non-conducting dielectric region. The dielectric region is preferably comprised of one or more materials preferably having a high dielectric constant and low leakage current characteristics. Example materials include silicon compounds, such as $SiO_2$, and $Si_3N_4$. $Si_3N_4$ is typically preferred due to its higher dielectric constant than $SiO_2$.

Numerous capacitor dielectric materials have been and are being developed in an effort to meet the increasing stringent requirements associated with the production of smaller and smaller capacitor devices used in higher density integrated circuitry. Most of these materials do, however, add increased process complexity or cost over utilization of conventional $SiO_2$ and $Si_3N_4$ capacitor dielectric materials.

One dielectric region in use today includes a composite of silicon oxide and silicon nitride layers. Specifically, a first capacitor electrode is formed to have a silicon oxide comprising layer, typically silicon dioxide, of 6 to 10 Angstroms thereover. Such might be formed by deposition, or more typically by ambient or native oxide formation due to oxidation of the first electrode material (for example conductively doped polysilicon) when exposed to clean room ambient atmosphere. Thereafter, a silicon nitride layer is typically deposited by low pressure chemical vapor deposition. This can, however, undesirably produce very small pinholes in the silicon nitride layer, particularly with thin layers of less than 200 Angstroms, with the pinholes becoming particularly problematic in layers of less than or equal to about 75 Angstroms thick. These pinholes can undesirably reduce film density and result in undesired leakage current in operation.

One technique for filling such pinholes is to wet oxidize the substrate, for example at 750° C.–800° C., atmospheric pressure, and feeding 5 slpm $H_2$, 10 slpm $O_2$ for 15–60 minutes. Such forms silicon oxide material which fills the pinholes and forms a silicon oxide layer typically from about 5 Angstroms to about 25 Angstroms thick over the silicon nitride. It is generally desirable, however, to overall minimize the thermal exposure of the wafer/substrate upon which integrated circuitry is being fabricated. Exposure to 750° C.–800° C. for from 15 minutes–60 minutes is significant in this regard.

SUMMARY

The invention includes methods of forming capacitors and methods of forming capacitor dielectric layers. In one implementation, a method of forming a capacitor dielectric layer includes forming a silicon nitride comprising layer over a substrate. The substrate with silicon nitride comprising layer is provided within a chamber. An oxygen comprising plasma is generated remote from the chamber. The remote plasma generated oxygen is fed to the substrate within the chamber at a substrate temperature of no greater than 750° C. effective to form a silicon oxide comprising layer over the silicon nitride comprising layer.

In one implementation, a method of forming a capacitor includes forming first capacitor electrode material comprising silicon over a semiconductor substrate. A silicon nitride comprising layer is formed over the first capacitor electrode material. The silicon nitride comprising layer has pinholes formed therein. The semiconductor substrate with silicon nitride comprising layer is provided within a chamber. An oxygen comprising plasma is generated remote from the chamber. The remote plasma generated oxygen is fed to the semiconductor substrate within the chamber at a substrate temperature of no greater than 550° C. and for no longer than 30 seconds effective to form a silicon oxide comprising layer over the silicon nitride comprising layer and effective to fill said pinholes with silicon oxide. The chamber is essentially void of hydrogen during the feeding. After the feeding, a second capacitor electrode material is formed over the silicon oxide comprising layer.

BRIEF DESCRIPTION OF THE DRAWINGS

Preferred embodiments of the invention are described below with reference to the following accompanying drawings.

FIG. 3 is a view of the FIG. 1 wafer fragment at a processing step subsequent to that shown by FIG. 1.

FIG. 4 is a view of the FIG. 3 wafer fragment at a processing step subsequent to that shown by FIG. 3.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
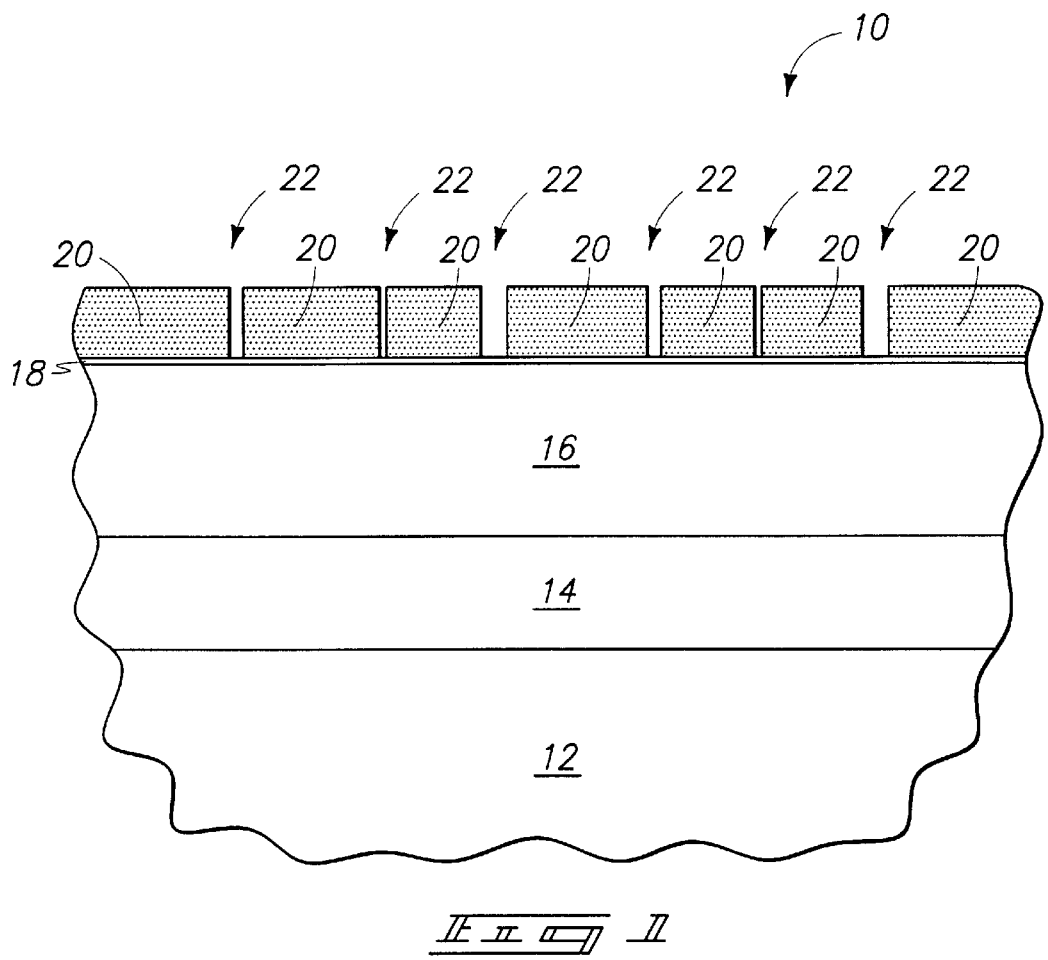
FIG. 1 is a diagrammatic sectional view of a semiconductor wafer fragment in process in accordance with an aspect of the invention.

Referring initially to FIG. 1, a wafer fragment in process in accordance with a method of forming a capacitor in accordance with an aspect of the invention is indicated generally with reference numeral 10. Such comprises a bulk monocrystalline silicon substrate 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" includes both the plural and the singular unless otherwise indicated. An insulative layer 14, for example doped or undoped silicon dioxide, or silicon nitride, is formed over bulk substrate 12.

A first capacitor electrode material 16 is formed over insulative layer 14. At this point, or preferably later in the process, electrode material 16 is ultimately patterned/provided into some desired first capacitor electrode shape.

Exemplary materials for electrode 16 include silicon (for example polysilicon) metals, conductive metal oxides, and any other conductive layer. An exemplary thickness in one preferred embodiment, and particularly where layer 16 comprises polysilicon, is 600 Angstroms. A first or inner silicon oxide comprising layer 18 is formed over, and "on" as shown, first capacitor electrode 16. An exemplary method for forming layer 18 is by oxidizing an outer portion of electrode material 16, for example by exposure to clean room ambient. This oxide layer is not preferred, but rather an effect of an exposed silicon or other oxidizable substrate. Typical thickness for layer 18 is less than or equal to 15 Angstroms. Layer 18 preferably consists essentially of silicon dioxide.

A silicon nitride comprising layer 20 is formed over first capacitor electrode material 16 and in the illustrated preferred embodiment is formed on first or inner silicon oxide comprising layer 18. An exemplary thickness is from 30 Angstroms to 80 Angstroms. In but one embodiment, silicon nitride comprising layer 20 is formed to have a plurality of pinholes 22 formed therein. Such are shown in exaggerated width/size in the figures for clarity. In the illustrated embodiment, at least some pinholes extend completely through layer 20 to silicon oxide comprising layer 18. Silicon nitride comprising layer 20 might be deposited by any existing or yet-to-be developed technique, with chemical vapor deposition or plasma enhanced chemical vapor deposition being but examples. One exemplary process whereby a silicon nitride layer 20 is deposited by chemical vapor deposition includes $NH_3$ at 300 sccm, dichlorosilane at 100 sccm, 750 mTorr, 600° C., and 60 minutes of processing.

Figure 2:
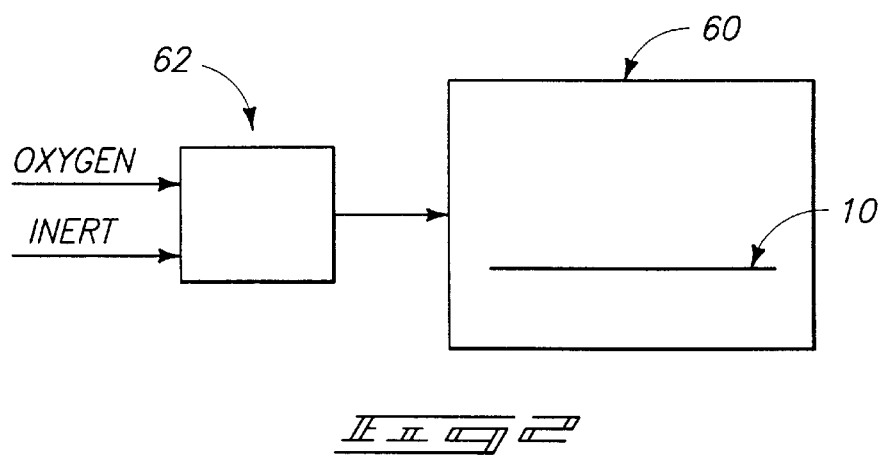
FIG. 2 is a diagrammatic view of processing equipment.

Referring to FIG. 2, semiconductor substrate 10 with silicon nitride comprising layer 20 is provided within a processing chamber 60. The processing chamber might be the same or different from any chamber utilized to produce any of the FIG. 1 construction. An example preferred processing chamber is a rapid thermal processor, with the invention being reduced to practice using an Applied Materials RTP-XE Chamber having a volume of 2700 cc. A suitable remote plasma generator 62 is diagrammatically shown and provided upstream of processing chamber 60. Any suitable remote plasma generation is contemplated, whether existing or yet-to-be-developed, with by way of example only microwave and RF plasma generation being examples. The invention was reduced to practice using an ASTEX F120160-02 power source with a microwave unit number Ax3151-1, available from ASTEX of Wilmington, Mass. FIG. 2 depicts a suitable oxygen gas feed and an inert gas feed to the diagrammatic remote plasma generator 62.

An oxygen comprising plasma is generated remote from chamber 60, for example in generator 62. The remote plasma generated oxygen is then fed to the semiconductor substrate within chamber 60, with the substrate temperature being no greater than 750° C., effective to form a silicon oxide comprising layer 24 (FIG. 3) over, preferably "on" as shown, silicon nitride comprising layer 20, and effective to fill pinholes 22 with silicon oxide. More preferably, the substrate temperature during the feeding is maintained at no greater than 550° C., and even more preferably no greater than 500° C. Further preferably, the feeding is for no longer than 1 minute, with a feeding of less than or equal to 30 seconds being more preferred, and a feeding of less than or equal to 15 seconds being most preferred. In the most preferred embodiment, layers 18, 20 and 24 constitute a dielectric region 27 of the capacitor being formed, with such dielectric region consisting essentially of an ONO composite which consists essentially of such silicon oxide comprising-silicon nitride comprising-silicon oxide comprising layers.

The oxygen comprising plasma is preferably derived, at least in part, from a gas selected from the group consisting of $O_2$, $O_3$, $N_yO_x$ (with "x" and "y" being greater than zero) and mixtures thereof. Further as shown in the FIG. 2 embodiment, the oxygen comprising plasma is preferably generated, at least in part, from a suitable inert gas in addition to an oxygen feed gas. Examples include $N_2$, Ar and He. One specific example includes an oxygen comprising plasma derived, at least in part, from feeding $O_2$ and $N_2$. Another exemplary embodiment in accordance with the above parameters includes forming an oxygen comprising plasma derived, at least in part, from $N_2O$ and at least one of Ar and He. Preferably in such latter example, the ultimate feeding of the remote generated plasma material to chamber 60 is void of feeding of $N_2$ but for $N_2$ which is inherently produced from the dissociation of $N_2O$ in the generation of the remote plasma. Further preferably, and contrary to the prior art described above, chamber 60 is essentially void of hydrogen during the feeding, thereby preventing any steam formation. In the context of this document, "essentially void" means below detectable levels.

A specific example with respect to the FIG. 2 processing with the ASTEX and Applied Materials equipments includes a feed of 2000 sccm with $O_2$ and 1000 sccm of $N_2$. Pressure within the remote plasma unit was maintained at approximately 2.9 Torr with microwave power provided at 2000 Watts. Temperature of the wafer was 650° C., with pressure maintained at 2.9 Torr. By way of example only, and with respect to the above-identified reduction-to-practice equipment, pressure is preferably maintained within the system at from 1 to 8 Torr, power supplied to the remote plasma generator at from 500 Watts to 3000 Watts, and temperature maintained within the system at from 500° C. to 750° C. Preferred flow ranges for each of $O_2$ and $N_2$ are from 0.5 slm to 5 slm. Temperatures as low as 350° C. might be used with other equipment.

The above-described preferred embodiments, in the fabrication of a capacitor dielectric region such as region 27, reduces the thermal exposure as compared to the prior art, in the most preferred embodiment, from in excess of 750° C. to less than 550° C., and further with the preferred embodiment reducing the exposure time even at the reduced temperature to well less than 1 minute. Properties of the capacitor dielectric region formed as described above appear comparable to ONO layers produced by prior art methods. For example, exposure of the dielectric region nitride to a remote oxygen plasma at 2000 Watts for 10 seconds resulted in a capacitor dielectric region having capacitance and leakage approximately equivalent to a prior art control wet oxidation. Further, an improvement in breakdown voltage for the 2000 Watt, 10 second treatment indicates that an increased capacitance via reduced thickness might be feasible, also.

Referring to FIG. 4, and after the feeding, a second capacitor electrode material 40 is formed over silicon oxide comprising layer 24. In the preferred and illustrated embodiment, second capacitor electrode material 40 is formed on (in contact with) oxide layer 24. An exemplary thickness for layer 40 is from 300 Angstroms to 600 Angstroms. Second electrode material 40 might comprise the same or different materials from first electrode material 16.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a capacitor comprising:

forming first capacitor electrode material over a semiconductor substrate;

forming a silicon nitride comprising layer over the first capacitor electrode material;

providing the semiconductor substrate with silicon nitride comprising layer within a chamber;

generating an oxygen comprising plasma remote from the chamber, the oxygen comprising plasma being generated at least in part from one of a) a mixture of $O_2$ and $O_3$; b) a mixture of $O_2$ and $N_2O$; c) a mixture of ) $O_3$ and $N_2O$; or d) a mixture of $O_2$, $O_3$ and $N_2O$;

feeding the remote plasma generated oxygen to the semiconductor substrate within the chamber for no longer than 15 seconds at a substrate temperature of from 550° C. to 750° C. effective to form a silicon oxide comprising layer over the silicon nitride comprising layer; and after the feeding, forming second capacitor electrode material over the silicon oxide comprising layer.

2. The method of claim 1 wherein the chamber comprises a rapid thermal processing chamber.

3. The method of claim 1 wherein the chamber is essentially void of hydrogen during the feeding.

4. The method of claim 1 wherein the oxygen comprising plasma is at least in part generated from an inert gas.

5. The method of claim 1 wherein the period of time is 10 seconds.

6. The method of claim 1 wherein the substrate temperature is 650° C.

7. The method of claim 1 wherein the oxygen comprising plasma is generated at least in part from a mixture of $O_2$ and $O_3$.

8. The method of claim 1 wherein the oxygen comprising plasma is generated at least in part from a mixture of $O_2$ and $N_2O$.

9. The method of claim 1 wherein the oxygen comprising plasma is generated at least in part from a mixture of $O_3$ and $N_2O$.

10. The method of claim 1 wherein the oxygen comprising plasma is generated at least in part from a mixture of $O_2$, $O_3$ and $N_2O$.

11. A method of forming a capacitor comprising:

forming first capacitor electrode material comprising silicon over a semiconductor substrate;

forming a silicon nitride comprising layer over the first capacitor electrode material, the silicon nitride comprising layer comprising pinholes formed therein;

providing the semiconductor substrate with silicon nitride comprising layer within a chamber;

generating an oxygen comprising plasma remote from the chamber, the oxygen comprising plasma being generated at least in part from one of a) a mixture of $O_2$ and $O_3$; b) a mixture of $O_2$ and $N_2O$; c) a mixture of $O_3$ and $N_2O$; or d) a mixture of $O_2$, $O_3$ and $N_2O$;

feeding the remote plasma generated oxygen to the semiconductor substrate within the chamber for no longer than 15 seconds at a substrate temperature of from 550° C. to 750° C. effective to form a silicon oxide comprising layer over the silicon nitride comprising layer and effective to fill said pinholes with silicon oxide, the chamber being essentially void of hydrogen during the feeding; and after the feeding, forming second capacitor electrode material over the silicon oxide comprising layer.

12. The method of claim 11 further comprising forming a silicon oxide comprising layer over the first capacitor electrode material prior to forming the silicon nitride comprising layer, the capacitor being formed to have a dielectric region consisting essentially of an ONO composite consisting essentially of said silicon oxide comprising layer and said silicon nitride comprising layer.

13. The method of claim 11 wherein the oxygen comprising plasma is at least in part generated from an inert gas.

14. The method of claim 11 wherein the period of time is 10 seconds.

15. The method of claim 11 wherein the substrate temperature is 650° C.

16. The method of claim 11 wherein the oxygen comprising plasma is generated at least in part from a mixture of $O_2$ and $O_3$.

17. The method of claim 11 wherein the oxygen comprising plasma is generated at least in part from a mixture of $O_2$ and $N_2O$.

18. The method of claim 11 wherein the oxygen comprising plasma is generated at least in part from a mixture of $O_3$ and $N_2O$.

19. The method of claim 11 wherein the oxygen comprising plasma is generated at least in part from a mixture of $O_2$, $O_3$ and $N_2O$.

20. A method of forming a capacitor dielectric layer, comprising:

forming a silicon nitride comprising layer over a substrate;

providing the substrate with silicon nitride comprising layer within a chamber;

generating an oxygen comprising plasma remote from the chamber, the oxygen comprising plasma being generated at least in part from $O_3$; and feeding the remote plasma generated oxygen to the substrate within the chamber at a substrate temperature of no greater than 750° C. effective to form a silicon oxide comprising layer on the silicon nitride comprising layer.

21. The method of claim 20 wherein the chamber comprises a rapid thermal processing chamber.

22. The method of claim 20 wherein the substrate temperature during the feeding is no greater than 550° C.

23. The method of claim 20 wherein the substrate temperature during the feeding is no greater than 500° C.

24. The method of claim 20 wherein the feeding is for no longer than 1 minute.

25. The method of claim 20 wherein the feeding is for no longer than 30 seconds.

26. The method of claim 20 wherein the feeding is for no longer than 15 seconds.

27. The method of claim 20 wherein the chamber is essentially void of hydrogen during the feeding.

28. The method of claim 20 wherein the oxygen comprising plasma is at least in part generated from an inert gas.

29. The method of claim 20 further comprising forming a silicon oxide comprising layer over the first capacitor electrode material prior to forming the silicon nitride comprising layer, the capacitor being formed to have a dielectric region consisting essentially of an ONO composite consisting essentially of said silicon oxide comprising layer and said silicon nitride comprising layer.

30. A method of forming a capacitor dielectric layer, comprising:

forming a silicon nitride comprising layer over a substrate;

providing the substrate with silicon nitride comprising layer within a chamber;

generating an oxygen comprising plasma remote from the chamber, the oxygen comprising plasma being generated at least in part from one of a) a mixture of $O_2$ and $O_3$; b) a mixture of $O_2$ and $N_2O$; c) a mixture of $O_3$ and $N_2O$; or d) a mixture of $O_2$, $O_3$ and $N_2O$; and feeding the remote plasma generated oxygen to the substrate within the chamber for no longer than 15 seconds at a substrate temperature of from 550° C. to 750° C. effective to form a silicon oxide comprising layer over the silicon nitride comprising layer.

31. The method of claim 30 wherein the period of time is 10 seconds.

32. The method of claim 30 wherein the substrate temperature is 650° C.

33. The method of claim 30 wherein the oxygen comprising plasma is generated at least in part from a mixture of $O_2$ and $O_3$.

34. The method of claim 30 wherein the oxygen comprising plasma is generated at least in part from a mixture of $O_2$ and $N_2O$.

35. The method of claim 30 wherein the oxygen comprising plasma is generated at least in part from a mixture of $O_3$ and $N_2O$.

36. The method of claim 30 wherein the oxygen comprising plasma is generated at least in part from a mixture of $O_2$, $O_3$ and $N_2O$.

* * * * *

UNITED STATES PATENT AND TRADEMARK OFFICE
CERTIFICATE OF CORRECTION

PATENT NO. : 6,723,599 B2
DATED : April 20, 2004
INVENTOR(S) : Denise M. Eppich et al It is certified that error appears in the above-identified patent and that said Letters Patent is hereby corrected as shown below:

Column 3,
Line 47, replace "ASTEX F120160-02 power source with a microwave unit" with -- ASTEX FI20160-02 power source with a microwave unit --

Column 5,
Line 20, replace "$O_3$; b) a mixture of $O_2$ and $N_2O$; c) a mixture of ) $O_3$" with -- $O_3$; b) a mixture of $O_2$ and $N_2O$; c) a mixture of $O_3$ --

Signed and Sealed this

Twenty-first Day of September, 2004

JON W. DUDAS
*Director of the United States Patent and Trademark Office*